United States Patent [19]

Murdock

[11] Patent Number: 5,243,623

[45] Date of Patent: Sep. 7, 1993

[54] SWITCHABLE MULTI-MODE TRANSCEIVER INTERFACE DEVICE

[75] Inventor: Gary S. Murdock, San Jose, Calif.

[73] Assignee: National Semiconductor Corporation, Santa Clara, Calif.

[21] Appl. No.: 588,011

[22] Filed: Sep. 25, 1990

[51] Int. Cl.$^5$ .......................... H04B 3/50; H04L 25/02
[52] U.S. Cl. .......................................... 375/7; 370/27; 375/36; 330/275
[58] Field of Search ................... 375/7, 8, 36; 370/27, 370/31; 455/73, 78; 178/63 R, 63 B, 63 C, 71 R; 307/475, 465, 466, 46 B; 330/261, 295, 296, 262, 275, 117, 118, 122

[56] References Cited

U.S. PATENT DOCUMENTS

| | | | |
|---|---|---|---|
| 3,333,113 | 7/1967 | Cole | 307/248 |
| 4,254,501 | 3/1981 | Griffith et al. | 370/31 |
| 4,385,394 | 5/1983 | Pace | 178/63 R |
| 4,393,494 | 7/1983 | Belforte et al. | 370/27 |
| 4,647,912 | 3/1987 | Bates et al. | 375/36 |
| 4,825,402 | 4/1989 | Jalali | 375/36 |
| 4,929,941 | 5/1990 | Lecocq | 370/27 |

OTHER PUBLICATIONS

Electronically Switchable Interface Circuit with Multiple EIA Protocol Drivers and Receivers; IBM Technical Disclosure Bulletin; vol. 30, No. 11, Apr. 1988; pp. 478–482.

Primary Examiner—Benedict V. Safourek
Attorney, Agent, or Firm—Limbach & Limbach

[57] ABSTRACT

A transceiver interface device in accordance with the present invention includes features which allow the transceiver to be switched for operation in either a differential or a single-ended mode. First, the output levels of the transceiver's differential line driver are switchable between TTL levels and non-TTL levels with small differential swings. Second, the transceiver's differential receiver is switchable between a differential threshold and a single-ended TTL threshold. Third, while in differential mode, both outputs of the driver may be placed in the high impedance state or active at the same time, but it is also possible to switch to a single-ended mode in which one driver output is in the high impedance state while the other can be switched between being active or being in the high impedance state. Fourth, the transceiver uses the SCSI standard DIFFSENS pin or driver enable signal for switching between differential mode and single-ended mode operation.

3 Claims, 11 Drawing Sheets

| VIN | MODE | DE | DO+ | DO− |
|---|---|---|---|---|
| X | 1 | 1 | ACTIVE | TRI-STATE |
| X | 1 | 0 | HIGH IMPEDANCE | HIGH IMPEDANCE |
| X | 2 | 1 | ACTIVE | ACTIVE |
| X | 2 | 0 | HIGH IMPEDANCE | HIGH IMPEDANCE |

X = DON'T CARE

SWITCHABLE MULTI-MODE TRANSCEIVER INTERFACE DEVICE

BACKGROUND OF THE INVENTION

1. Field of the Invention

The present invention relates to data communications systems and, in particular, to a line interface device that is switchable between single-ended and differential operating modes.

2. Discussion of the Prior Art

The increasing use of integrated logic circuits, such as TTL, MOS and CMOS components, in computer systems dictates the need for interface circuits. An interface circuit amplifies the low voltage/low current levels at the computer output ports either for transmission over a transmission medium (e.g., twisted pair, coaxial cable) or for use by higher voltage/higher current peripheral devices (e.g., displays, printers).

A line interface circuit is a type of interface circuit that transfers digital information from a computer or peripheral device over a transmission line.

A bi-directional line interface circuit, commonly referred to as a transceiver (TRANSmitter/reCEIVER), typically includes a line driver stage and receiver stage. The line driver amplifies digital signal outputs from the computer system so that they can be properly transmitted on the transmission medium. Conventional line drivers usually include level shifting capability to provide compatibility with different integrated circuit technologies (e.g. TTL) that might be used in the computer's internal logic. The receiver is typically a differential amplifier that receives signals from a two-wire transmission channel and provides a single-ended output representative of the digital information received on that channel.

Referring to FIG. 1, as stated above, a conventional differential transceiver 10 typically combines a differential line driver 12 and a differential receiver 14. Whether the transceiver network 10 operates as a receiver or a line driver (transmitter) is determined by the state of the enable signal DE/$\overline{RE}$. In the receiver mode, (DE/$\overline{RE}$=0) the driver 12 is disabled by placing its differential outputs in the high impedance state; the differential inputs from the transmission medium are thus applied to the inverting and non-inverting inputs of the differential-to single ended receiver 14 which, in turn, provides a system input via the I/O line. Similarly, in the transmit mode, (DE/$\overline{RE}$=1) receiver 14 is disabled by placing its output in the high impedance state; a system output is thus applied to driver 12 via the I/O line which, in turn, provides its differential outputs DO+/RI+ and DO−/RI− to the transmission medium.

In a single-ended configuration, the transceiver's line driver and receiver are single input-single output circuits.

Line interface circuits may be designed for general-purpose applications or may be designed for a specific, industry standard data-communications configuration.

One such industry standard data-transmission configuration is the so-called Small Computer System Interface (SCSI) standard. American National Standard (ANS) X3.131 defines one line interface configuration for single-ended operation and a second line interface configuration for differential operation.

A problem arises because the SCSI single-ended and differential line interface configurations are incompatible. That is, a "single-ended" SCSI computer station cannot be connected to an SCSI system that is configured as "differential".

It would, therefore, be highly desirable to have available a transceiver interface device with the flexibility to be utilized both in single-ended and differential SCSI systems.

SUMMARY OF THE INVENTION

A transceiver interface device in accordance with the present invention includes line driver and receiver features which allow it to operate in either differential or single-ended computer systems. First, the line driver output levels are switchable between TTL levels and non-TTL levels having small differential swings. Second, the receiver is switchable between a differential threshold and a single-ended TTL threshold. Third, when in the differential mode, the line driver outputs may both be in the high impedance state at the same time; in the single-ended mode, the line driver outputs may both be in the high impedance state at the same time or have one output in the high impedance state while the other output is active. Fourth, the state of the DIFFSENS pin or the driver enable signal on the SCSI interface is used for mode switching between differential and single-ended operation. These features allow a single transceiver architecture to be utilized in both single-ended and differential applications.

A better understanding of the features and advantages of the present invention will be obtained by reference to the following detailed description and accompanying drawings which set forth an illustrative embodiment in which the foregoing features of the invention are utilized.

DETAILED DESCRIPTION OF THE PREFERRED EMBODIMENT

Figure 1:
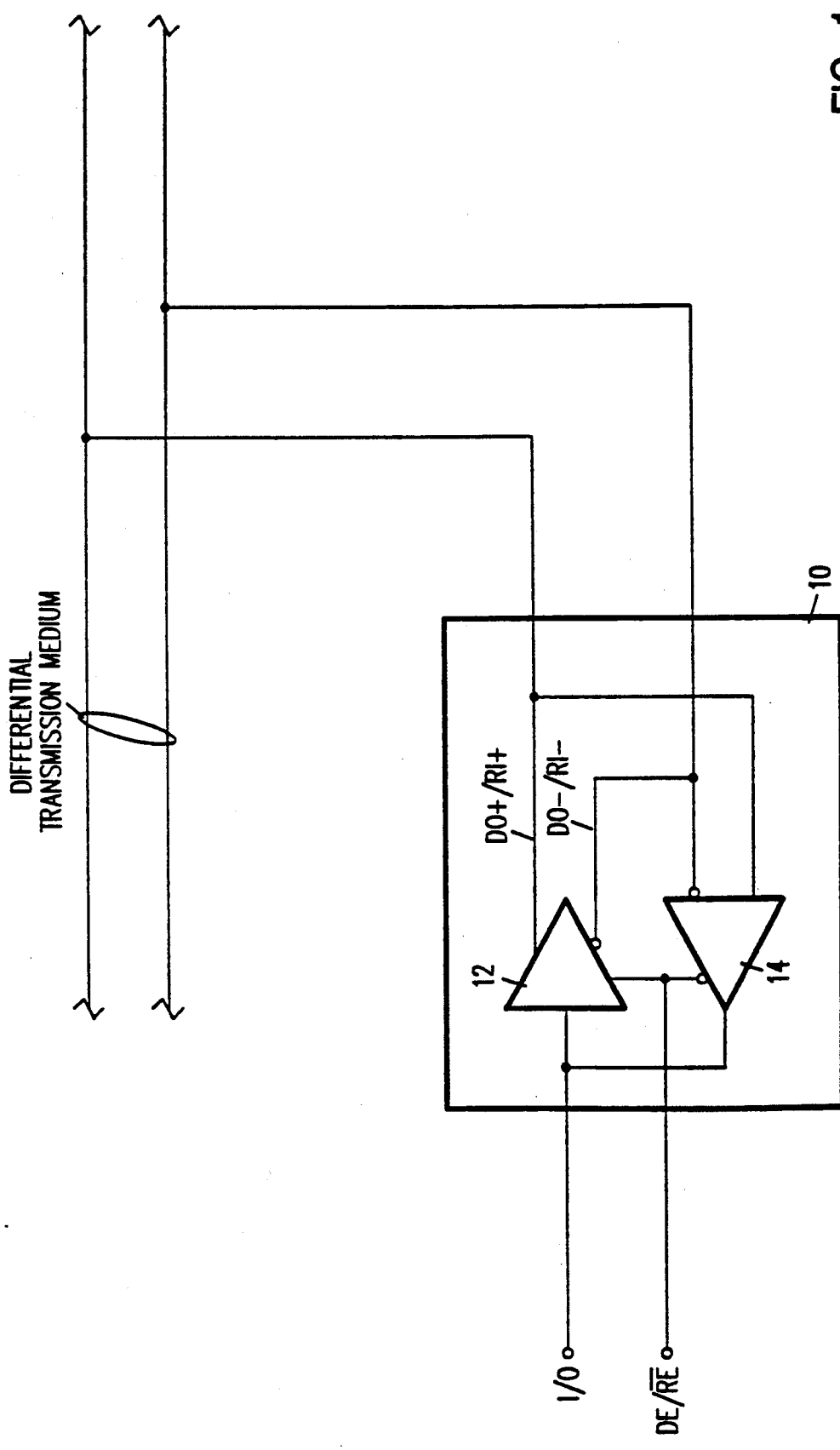
FIG. 1 is a block diagram illustrating a conventional differential transceiver.
Figure 2:
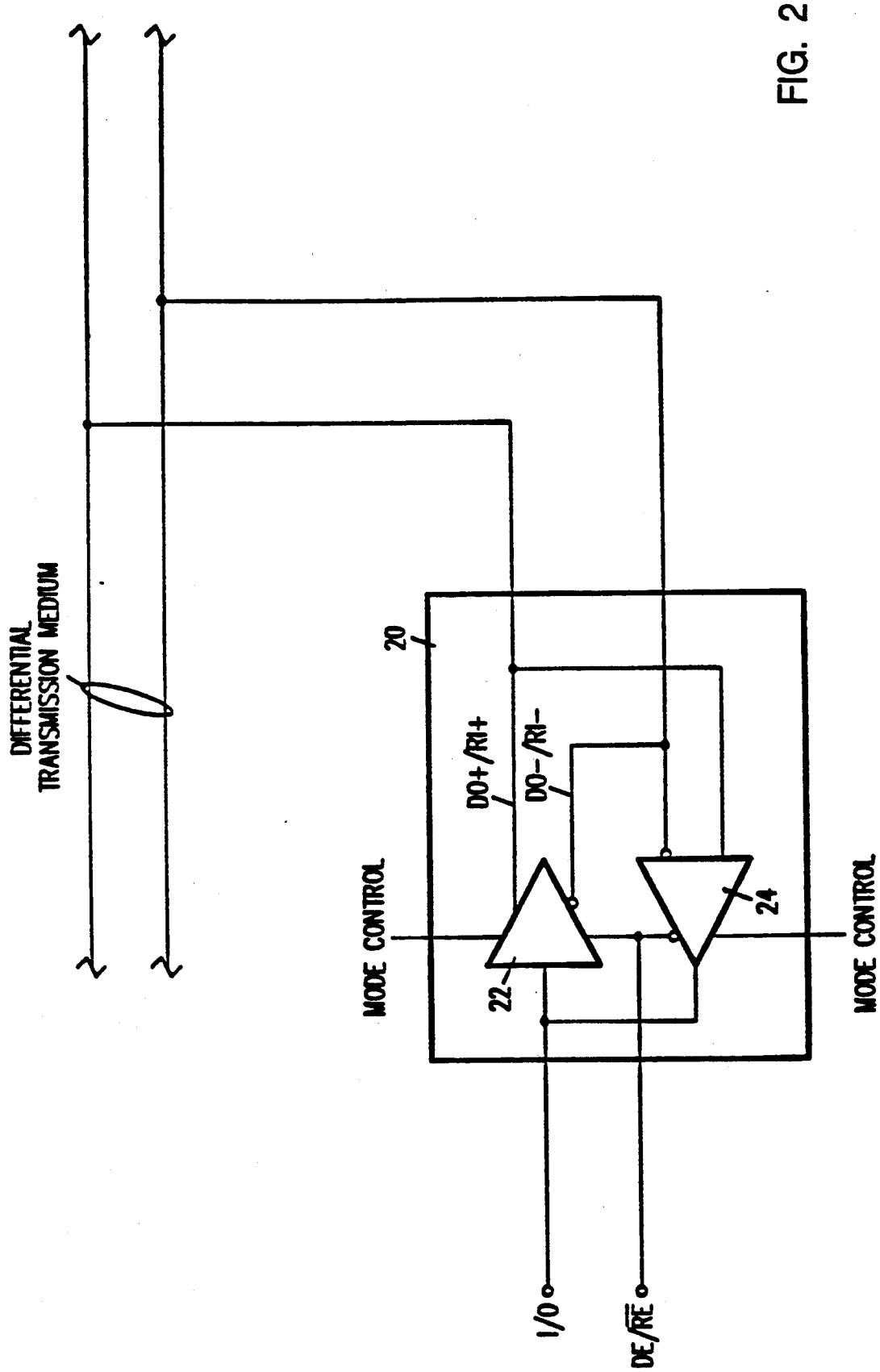
FIG. 2 is a block diagram illustrating a switchable transceiver interface device in accordance with the present invention.

FIG. 2 shows a block diagram of a switchable transceiver interface device 20 that includes a differential driver 22 and a differential receiver 24. Both the differential outputs DO+/RI+ and DO−/RI− of driver 22 and the inputs of the receiver 24 are connected to the lines of a differential transmission channel.

As described in greater detail below, the transceiver 20 may be configured in either a differential mode or a single-ended mode to enable it to be used in either differential or single-ended Small Computer System Interface (SCSI) systems. Thus, in accordance with one aspect of the present invention, the logic state of a mode control input signal to driver 22 determines whether the driver output levels are TTL levels or are non-TTL levels. In accordance with another aspect of the present invention, the logic state of the mode control input signal to receiver 24 determines whether the receiver threshold is differential or single-ended TTL. In accordance with a further aspect of the invention, a driver enable signal is used to place both outputs of driver 22 in the high impedance state when the transceiver 20 is in the differential mode, but may also be used to place the active driver output in the high impedance state when the transceiver 20 is in the single-ended mode (In the single-ended mode, one driver output is automatically placed in the high impedance state for as long as the transceiver is in the single-ended mode). In accordance with yet another aspect of the present invention, the mode input used to switch the operating modes of the transceiver 20 is derived from the SCSI standard DIFFSENS pin or driver enable line.

As stated above, each of these features of the invention will be discussed in greater detail below.

Figure 3B:
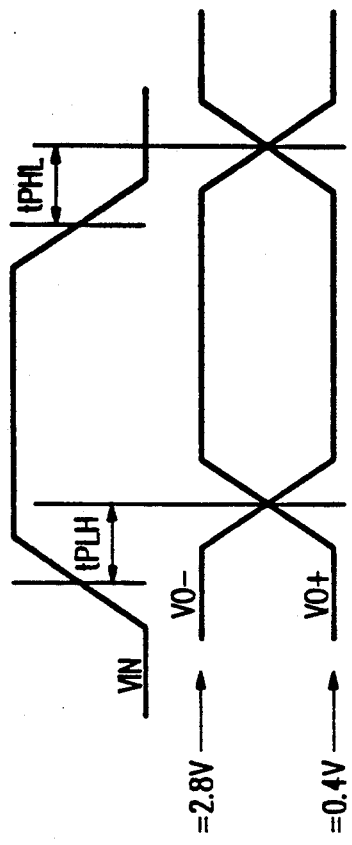
FIG. 3B is a timing diagram illustrating TTL VOH and VOL output level waveforms for the FIG. 3A switchable driver stage.
Figure 3D:
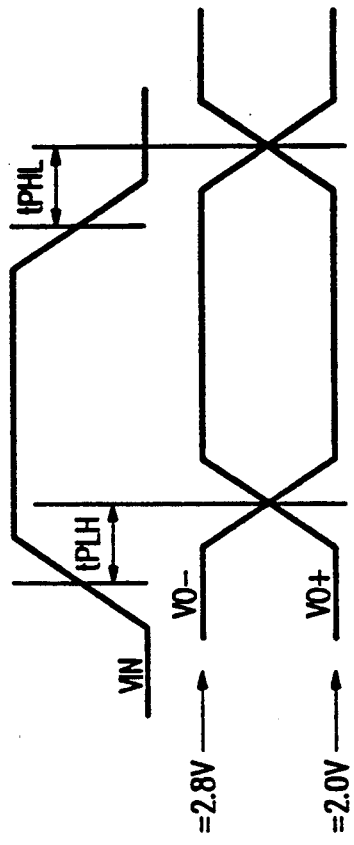
FIG. 3D is a timing diagram illustrating non-TTL VOH and/or VOL output level waveforms for the FIG. 3C switchable driver stage.
Figure 3A:
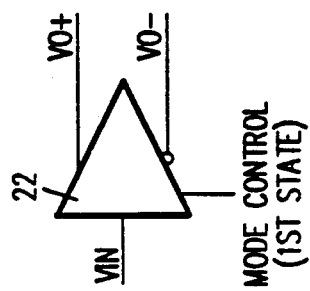
FIG. 3A is a logic symbol illustrating a switchable differential driver stage in a first mode control state.

Referring to FIGS. 3A and 3B, it can be seen that when the mode control input to driver 22 is in a first logic state (Mode I), then the driver 22 generates transistor-transistor-logic (TTL) output levels at its differential outputs. The TTL VOH level is approximately 2.8 V minimum; the TTL VOL level is approximately 0.4 V maximum.

Figure 3C:
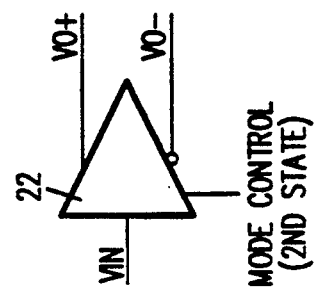
FIG. 3C is a logic symbol illustrating a switchable differential driver stage in a second mode control state.

FIGS. 3C and 3D further show that when the mode control input to the driver 22 is in a second logic state (Mode 2), then the driver 22 generates non-TTL output levels at its outputs. In the example shown in FIG. 3, the Mode 2 VOH output level remains at the 2.8 V TTL level, while the VOL output level is adjusted to approximately 2.0 V.

Figure 4B:
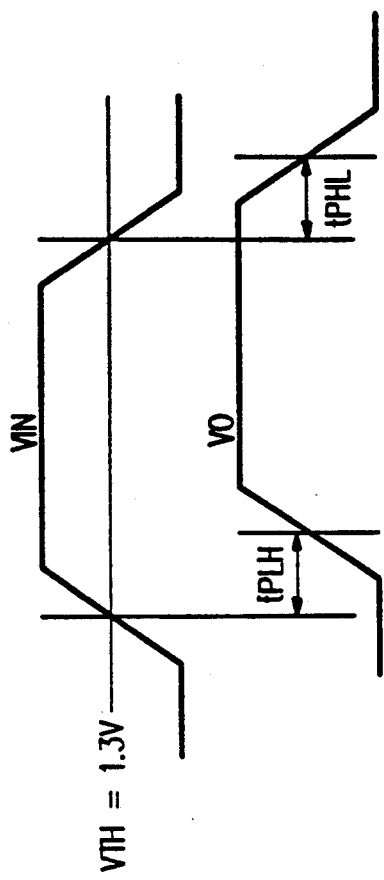
FIG. 4B is a timing diagram illustrating a single-ended TTL output level waveform for the FIG. 4A switchable receiver stage.
Figure 4D:
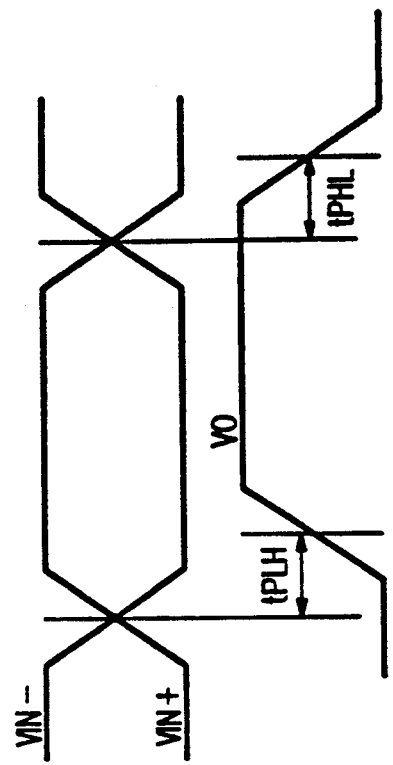
FIG. 4D is a timing diagram illustrating a differential output level waveform for the FIG. 4C switchable receiver stage.
Figure 4A:
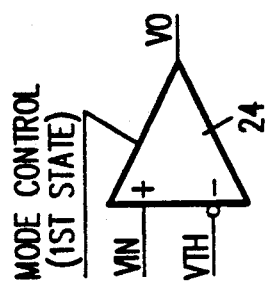
FIG. 4A is a logic symbol illustrating a switchable receiver stage in a first mode control state.

Referring to FIGS. 4A and 4B, it can be seen that when the mode control input to receiver 24 is the first logic state (Mode 1), then the threshold voltage V of receiver 24 is $V = VTH = TTL\ threshold,$ the TTL threshold typically being 1.3 V. The non-inverting input is the input to the single-ended receiver in Mode 2.

Figure 4C:
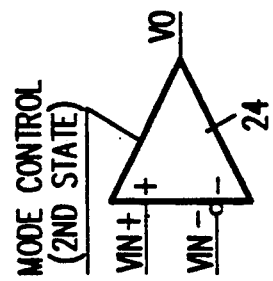
FIG. 4C is a logic symbol illustrating a switchable receiver stage in a second mode control state.

FIGS. 4C and 4D further show that when the mode control input to receiver 24 is the second logic state (Mode 2), then the threshold voltage V of the receiver 24 is $V = [(VIN+) - (VIN-)],$ V typically being about 200 mV maximum.

Figures 5A, 5B:
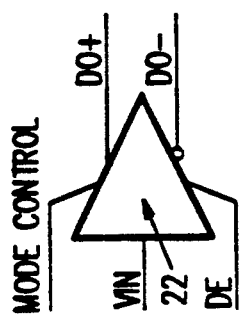
FIG. 5A is a logic symbol illustrating a switchable differential driver stage.
FIG. 5B is a state table defining the output state of the FIG. 5A driver stage in a variety of operating modes.

Referring to FIGS. 5A and 5B, it can be seen that the driver enable signal DE is utilizable for placing the outputs of driver 22 in the high impedance state in a variety of configurations.

When the driver 22 is in the differential mode, i.e., Mode 2, then signal DE high causes both outputs to be active; conversely, signal DE low places both outputs in the high impedance state. When the driver 22 is in the single-ended mode, i.e., Mode 1, signal DE high causes output DO+ to be active while output DO− is in the high impedance state; signal DE low places outputs DO+ and DO− in the high impedance state.

As stated above, the transceiver 20 switches between single-ended operation and differential operation depending upon the state of the mode control signal. As will be explained in greater detail below, in accordance with an embodiment of the invention, the mode control signal is derived from the DIFFSENS pin or driver enable signal defined in the SCSI standard.

Figure 6:
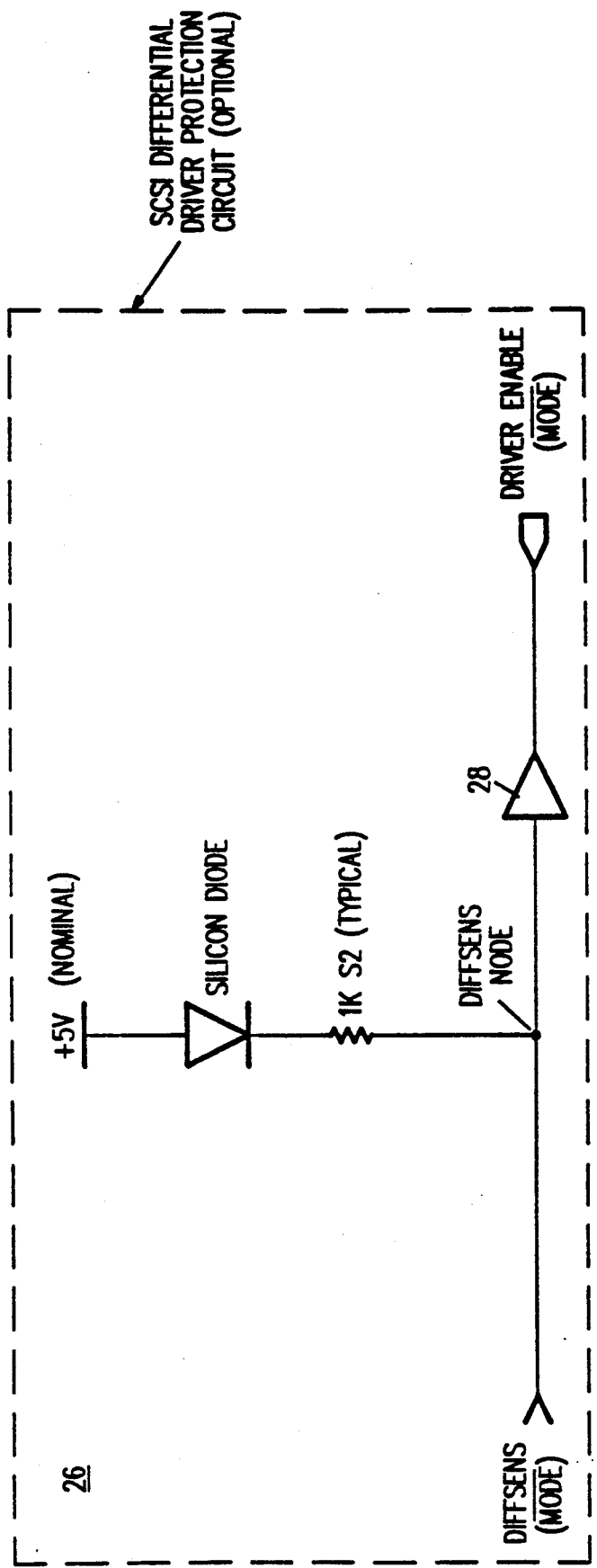
FIG. 6 is a circuit diagram illustrating use of the SCSI DIFFSENS pin or driver enable signal for deriving the transceiver mode signal for switching between different operating modes of a switchable transceiver interface device in accordance with the present invention.

FIG. 6 shows an SCSI differential sense/driver enable circuit 26 used to produce the mode control signal, identified as $\overline{MODE}$ in FIG. 6. According to the SCSI standard, the driver enable signal is used as a safety feature to disable the outputs of differential drivers when a differential-type SCSI transceiver driver is connected to a single-ended SCSI system. When this occurs, the DIFFSENS line is connected to ground, causing the DIFFSENS node to go low. Gate 28 then provides a low driver enable signal. In accordance with one aspect of the invention, the output of gate 28 or the DIFFSENS pin is used as the mode control signal $\overline{MODE}$ for the transceiver 20.

Figure 7:
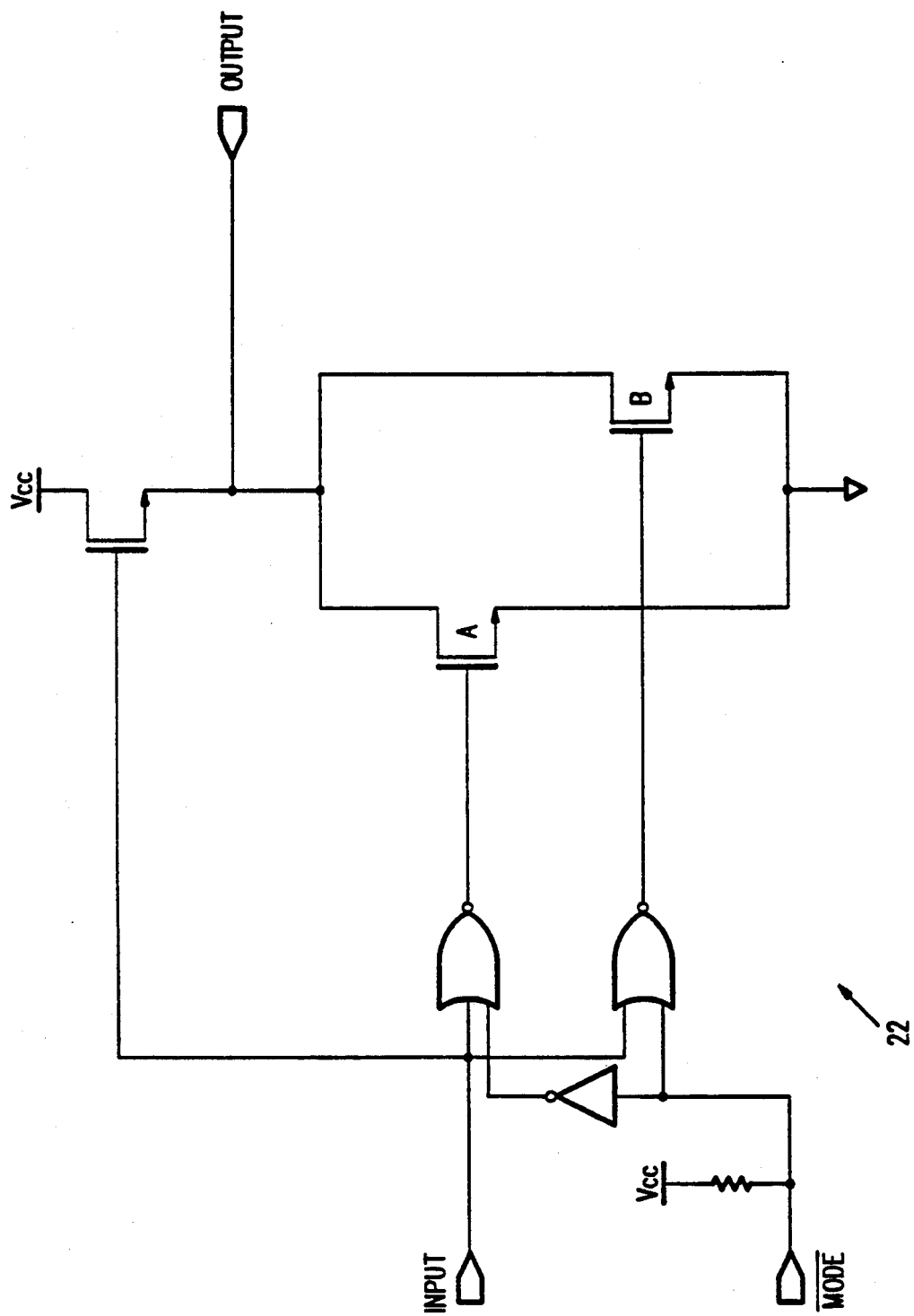
FIG. 7 is a circuit diagram illustrating a driver output stage that switches between a TTL and non-TTL output voltage.

FIG. 7 shows a driver 22 that switches between a TTL and non-TTL output voltage, as described above in conjunction with FIG. 3. In this case, the output low voltage VOL is switched. When the mode control signal $\overline{MODE}$ goes low, active pull-down gate B is selected. Gate B has a low resistance channel that pulls the output VOL down to a TTL low (0.4 V), which is compatible with single-ended SCSI systems. When the mode control signal $\overline{MODE}$ goes high, gate A is selected and the output low voltage VOL is higher (about 2 V) since gate A has a higher resistance channel than does gate B.

Figure 8:
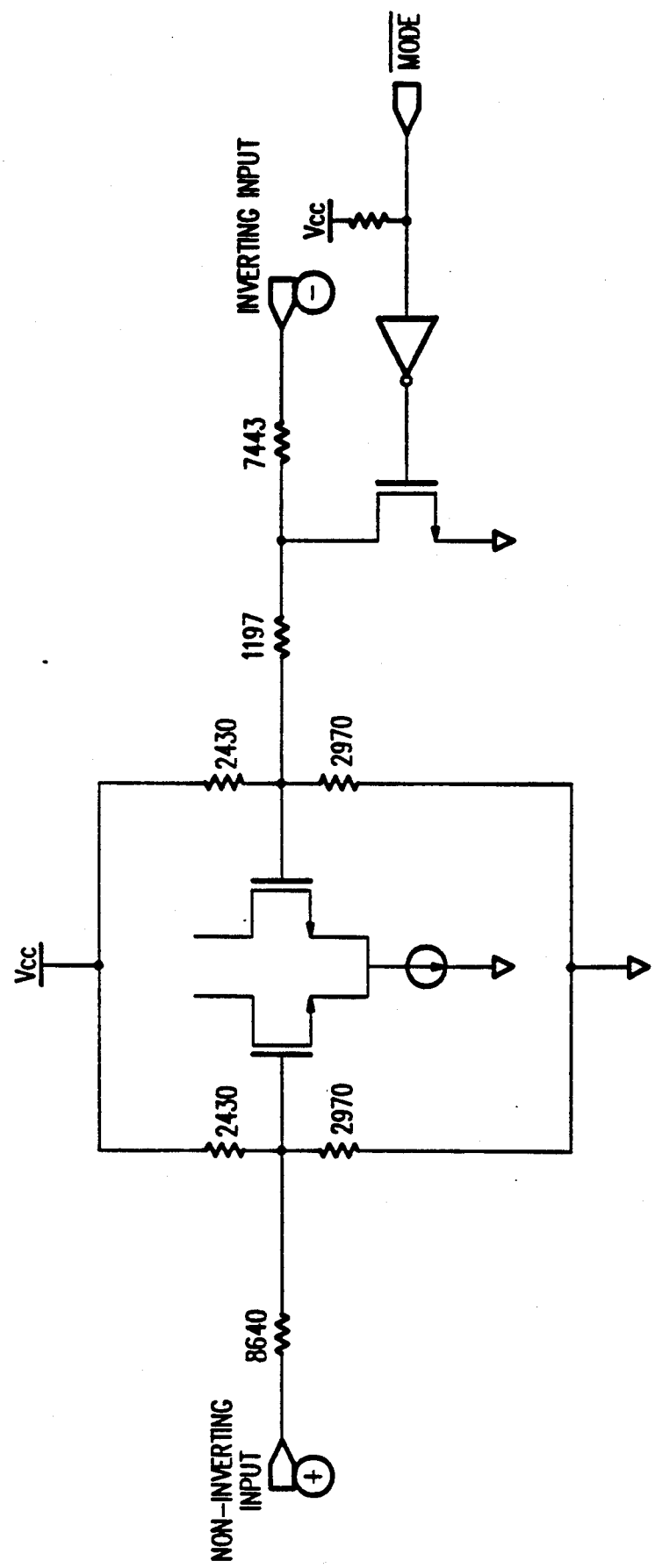
FIG. 8 is a circuit diagram illustrating a differential receiver input stage that switches from a differential input stage to a single-ended input stage with TTL threshold.

FIG. 8 shows a differential receiver input stage 24 that switches from a differential input stage to a single-ended input stage with a TTL threshold (about 1.3 V), as described above in conjunction with FIG. 4. When configured as a single-ended input stage, i.e., mode control signal $\overline{MODE}$ is low, single-ended signals are input via the non-inverting input. When configured as a differential input stage, i.e., mode control signal $\overline{\text{MODE}}$ is high, differential signals are input across the inverting and non-inverting inputs.

Figure 9:
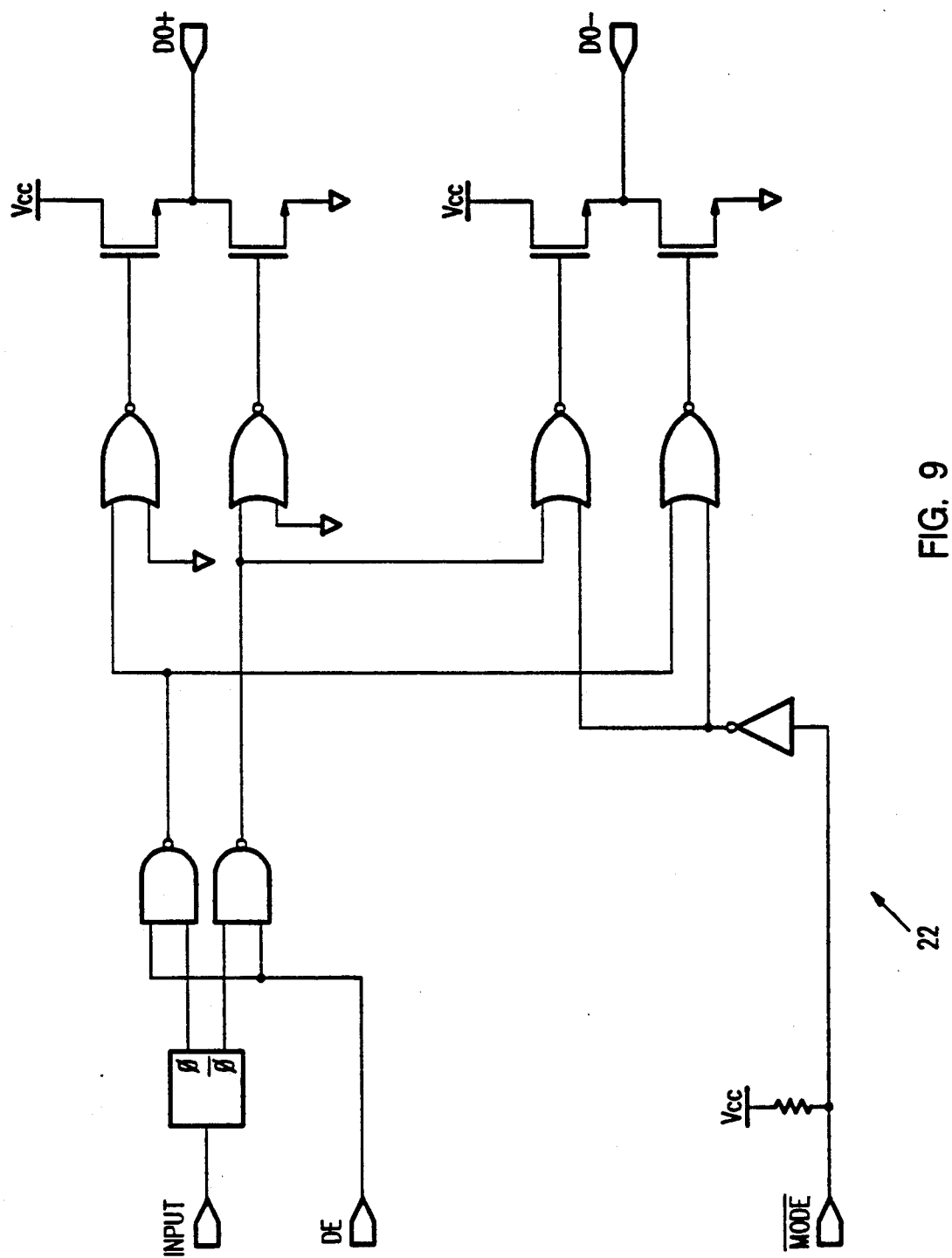
FIG. 9 is a circuit diagram illustrating a differential driver output stage wherein either one or both outputs can be placed in the high impedance state.

FIG. 9 shows a differential driver output stage 22 wherein either one or both outputs DO+, DO− can be placed in the high impedance state. The inverting output DO− is placed in the high impedance state when the mode control signal $\overline{\text{MODE}}$ goes low (the inverting output is grounded when connected to a single-ended SCSI system, so it must be placed in the high impedance state). With the mode control signal $\overline{\text{MODE}}$ low (single-ended mode), the state of the non-inverting output is controlled by the driver enable signal DE (active for DE high, high impedance state for DE low). With the mode control signal $\overline{\text{MODE}}$ high (differential mode), both outputs DO+, DO− are controlled by the driver enable signal DE (active for DE high, high impedance state for DE low).

Figure 10:
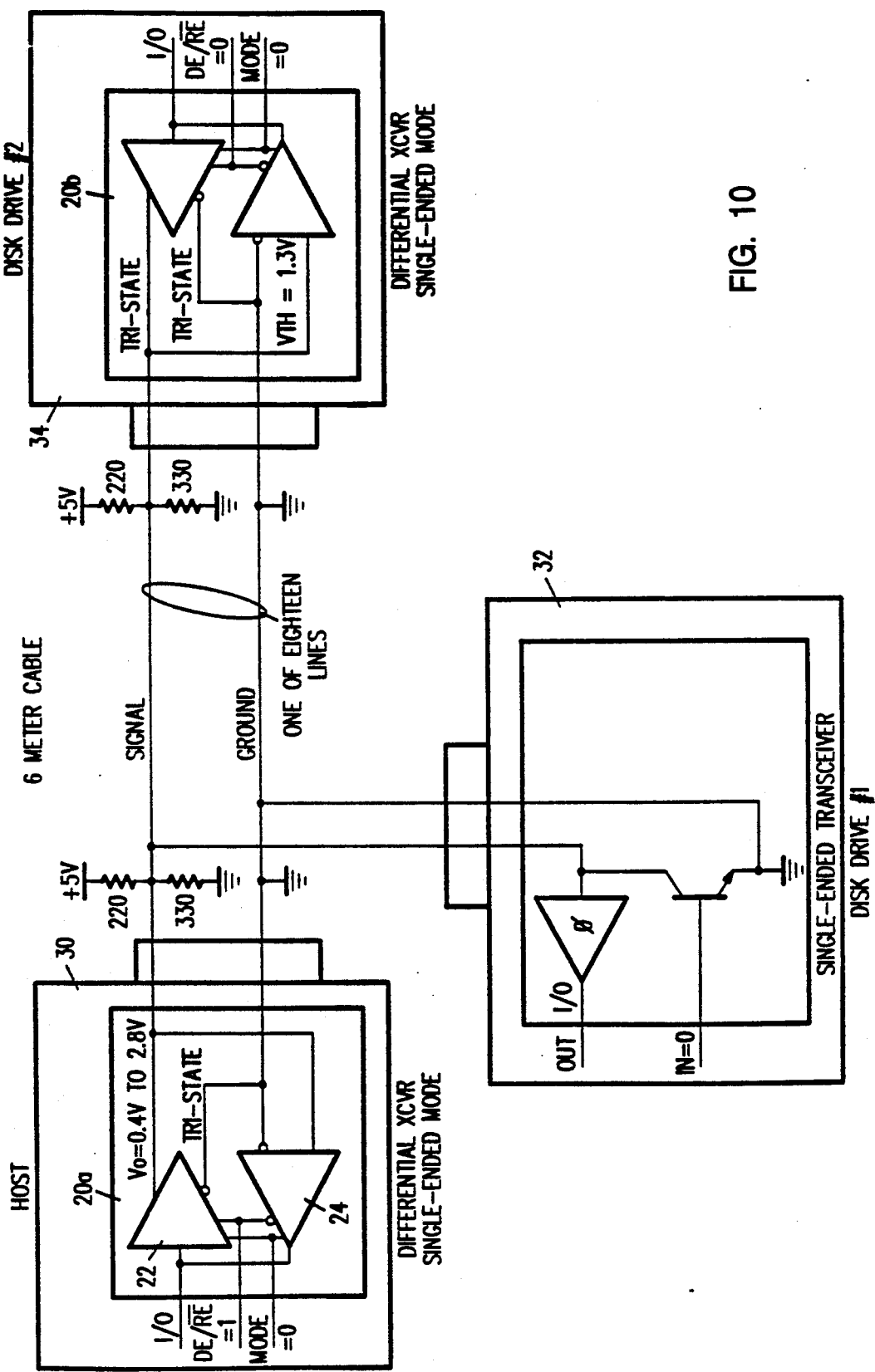
FIG. 10 illustrates switchable transceivers operating in the single-ended mode in accordance with the present invention.

FIG. 10 shows an example of switchable differential transceivers in accordance with the present invention operating in the single-ended mode In the FIG. 10 example, a host computer system 30 communicates with a #1 disk drive 32 and a #2 disk drive 34 via an 18-bit parallel bus. Only one of the eighteen two-wire transmission paths is illustrated in FIG. 10. In keeping with the single-ended system configuration, one of the two lines is biased to +3 V from a +5 V supply. The second line of the pair is tied to ground.

The host computer system 30 includes a switchable transceiver 20a operating in the single-ended mode as a driver. That is, based on the low state of its mode control input signal $\overline{\text{MODE}}$ and the high state of its enable control line DE/$\overline{\text{RE}}$, the single-ended output $V_O$ of driver 22 switches between TTL levels, with $V_{OL}=0.4$ and VOH=2.8 V, the output of receiver 24 is placed in the high impedance state and the driver inverting output is placed in the high impedance state. The state of the non-inverting driver output (active or high impedance) depends on the logic stat of the driver enable signal DE.

1 disk drive 32 utilizes a SCSI single-ended configuration open collector transceiver in receive mode (IN=0) which connects #1 disk drive 32 to the transmission medium.

2 disk drive 34 also includes a switchable differential transceiver 20b operating in the single-ended mode as a receiver. That is, based on the low state of its mode control input signal $\overline{\text{MODE}}$ and the low state of its enable control line DE/$\overline{\text{RE}}$, both outputs of driver 22 are in the high impedance state, the threshold of receiver 24 is set to the single-ended TTL level, $V_{TH}=1.3$ V, and the receiver output is active.

Figure 11:
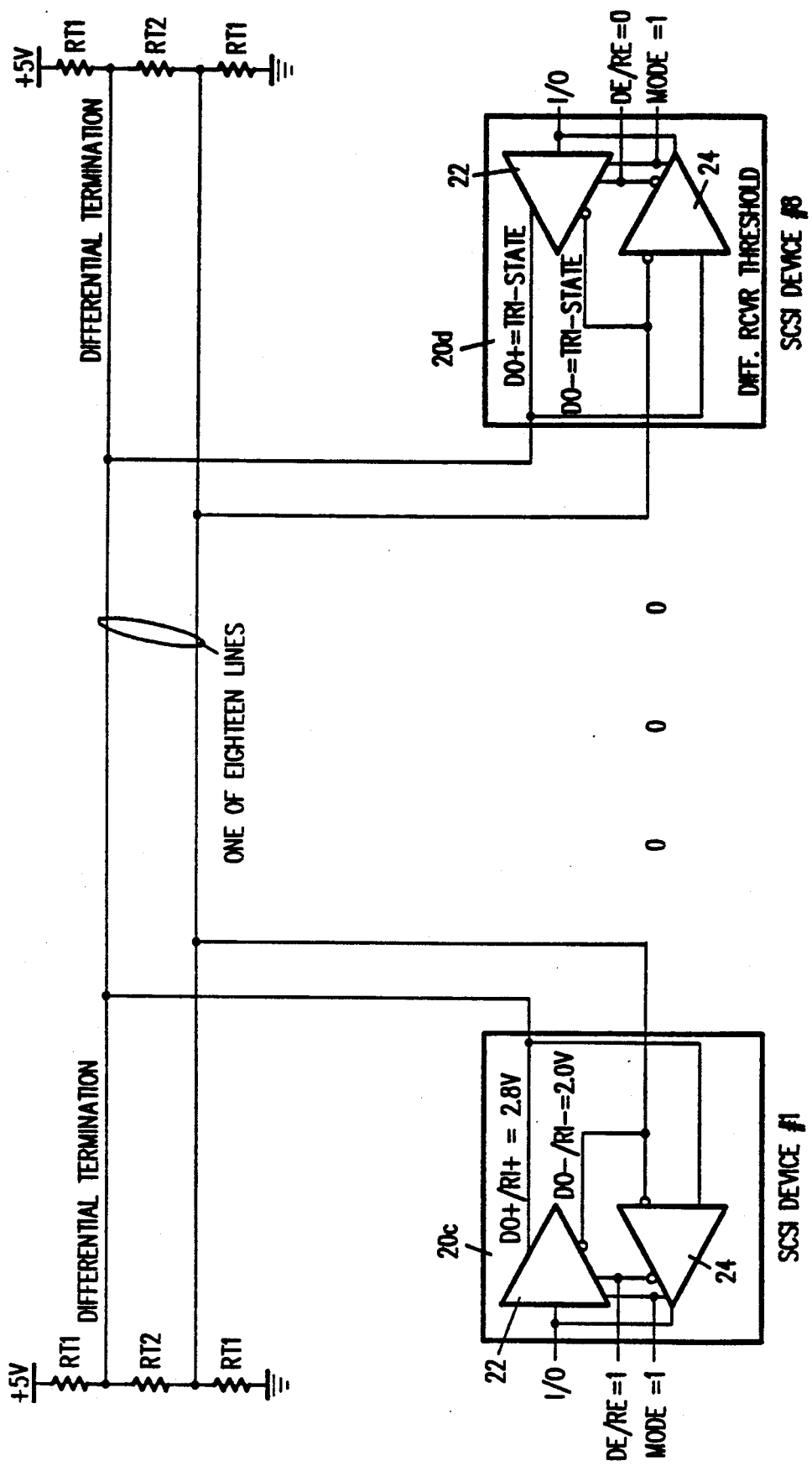
FIG. 11 illustrates switchable transceivers operating i the differential mode in accordance with the present invention.

FIG. 11 shows an example of switchable differential transceivers in accordance with the present invention operating in the differential mode. In the FIG. 11 example, SCSI device #1 through SCSI device #8 are connected to an 18-bit parallel bus which serves as the transmission medium for a computer Input/Output system, e.g., a peripheral bus. Again, only one of the eighteen two-wire transmission paths is illustrated. Both of the lines are biased from a +5 V supply.

As shown in FIG. 11, SCSI device #1 includes a switchable transceiver 20c which is configured as a differential driver. That is, with the mode control and enable control DE/$\overline{\text{RE}}$ set high, differential outputs DO+/RI+ and DO−/RI− of driver 22 are both active and switch between non-TTL levels with VOH=2.8 V and VOL=2.0 V; the output of receiver 24 is placed in the high impedance state.

As further shown in FIG. 11, SCSI device #8 includes a switchable transceiver 20d which is configured as a differential receiver. That is, with the mode control set high and the enable control DE/$\overline{\text{RE}}$ set low, receiver 24 is set to a differential threshold and the differential outputs DO+ and DO− of driver 22 are both placed in the high impedance state.

It should be understood that various alternatives to the embodiments of the invention described herein may be employed in practicing the invention. It is intended that the following claims define the scope of the invention and that methods and apparatus within the scope of these claims and their equivalents be covered thereby.

What is claimed is:

1. A switchable transceiver interface device connectable between a data system and a transmission medium for transferring data signals therebetween, the switchable transceiver interface device comprising:
   (a) a driver having differential outputs for transferring output data signals received from the data system via an input/output node of the transceiver interface device to the transmission medium, the driver including means responsive to first and second logic states of a driver enable signal to the driver when the mode control input signal is in the first logic state for maintaining both driver differential inputs active when the driver enable signal is in the first logic state and for placing both differential outputs in a high impedance state when the driver enable signal is in the second logic state and means responsive to the first and second logic states of the driver enable signal when the mode control input signal is in the first logic state for placing one of the driver differential outputs in the high impedance state while maintaining the other driver differential output active when the driver enable signal is in the second logic state; and
   (b) a differential receiver for transferring input data signals received from the transmission medium to the data system via the input/output node, the receiver including means responsive to the first and second logic states of a mode control input signal to the receiver for switching the receiver threshold between a differential receiver threshold and a single-ended receiver threshold, respectively.

2. A switchable transceiver interface device as in claim 1 wherein the driver further comprises:
   (a) means responsive to first and second logic states of a driver enable signal to the driver when the mode control input signal is in the first logic state for maintaining both driver differential inputs active when the driver enable signal is int he first logic state and for placing both differential outputs in a high impedance state when the driver enable signal is in the second logic state; and
   (b) means responsive to the first and second logic states of the driver enable signal when the mode control input signal is in the first logic state for placing one of the driver differential outputs in the high impedance state while maintaining the other driver differential output active when the driver enable signal is in the second logic state.

3. A switchable transceiver interface device as in claim 1 wherein, when the receiver is switched to a single-ended receiver threshold, the receiver comprises a TTL logic receiver.

* * * * *

UNITED STATES PATENT AND TRADEMARK OFFICE
CERTIFICATE OF CORRECTION

PATENT NO.    : 5,243,623
DATED         : September 7, 1993
INVENTOR(S)   : Gary S. Murdock It is certified that error appears in the above-identified patent and that said Letters Patent is hereby corrected as shown below:

Column 6,
Line 26, "the mode control input signal is in the"
should be deleted and replaced with -- a mode control input signal is in a --.
Line 28, "inputs active" should be deleted and replaced with -- outputs active --.
Line 34, "the first logic state" should be deleted and replaced with
-- a second logic state --.
Line 38 "second logic state" should be deleted and replaced with
-- the first logic state --.
Lines 47-63, please delete the following:
"2. A switchable transceiver interface device as in claim 1 wherein the
driver further comprises:
(a) means responsive to first and second logic states of a driver enable
signal to the driver when the mode control input signal is in the first logic
state for maintaining both driver differential inputs active when the driver
enable signal is in the first logic state and for placing both differential outputs
in a high impedance state when the driver enable signal is in the second
logic state; and
(b) means responsive to the first and second logic states of the driver
enable signal when the mode control input signal is in the first logic state
for placing one of the driver differential outputs in the high impedance state
while maintaining the other driver differential output active when the
driver enable signal is in the second logic state."

Signed and Sealed this

First Day of June, 2004

JON W. DUDAS
*Acting Director of the United States Patent and Trademark Office*